(12) United States Patent
Yim et al.

(10) Patent No.: US 8,451,620 B2
(45) Date of Patent: May 28, 2013

(54) PACKAGE INCLUDING AN UNDERFILL MATERIAL IN A PORTION OF AN AREA BETWEEN THE PACKAGE AND A SUBSTRATE OR ANOTHER PACKAGE

(75) Inventors: Myung Jin Yim, Chandler, AZ (US); Nanette Quevedo, Chandler, AZ (US); Richard Strode, Gilbert, AZ (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/627,937

(22) Filed: Nov. 30, 2009

(65) Prior Publication Data

US 2011/0128711 A1     Jun. 2, 2011

(51) Int. Cl.
*H05K 1/11*     (2006.01)
(52) U.S. Cl.
USPC ........................................................ 361/784

(58) Field of Classification Search
USPC ... 361/784, 760, 782, 783; 174/260; 257/528, 257/678, 783, 789
See application file for complete search history.

(56) References Cited

U.S. PATENT DOCUMENTS

| | | | |
|---|---|---|---|
| 7,323,360 B2 | 1/2008 | Gonzalez | |
| 7,485,502 B2 * | 2/2009 | Jeon et al. | 438/127 |
| 7,606,048 B2 * | 10/2009 | Cady et al. | 361/767 |
| 2004/0118599 A1 * | 6/2004 | Chason et al. | 174/260 |
| 2005/0180679 A1 * | 8/2005 | Shimizu et al. | 385/14 |
| 2010/0301464 A1 * | 12/2010 | Arshad | 257/676 |

* cited by examiner

*Primary Examiner* — Jeremy Norris
*Assistant Examiner* — Tremesha S Willis
(74) *Attorney, Agent, or Firm* — Perkins Coie LLP

(57) ABSTRACT

Embodiments include but are not limited to apparatuses and systems including semiconductor packages, e.g. memory packages, having a substrate or a first package, and a second package coupled to the substrate or the first package, wherein the second package includes at least one die and an underfill material disposed in a portion, but not an entirety, of an area between the package and the substrate or the first package. Other embodiments may be described and claimed.

32 Claims, 9 Drawing Sheets

PACKAGE INCLUDING AN UNDERFILL MATERIAL IN A PORTION OF AN AREA BETWEEN THE PACKAGE AND A SUBSTRATE OR ANOTHER PACKAGE

BACKGROUND

Conventionally, a package is mounted to a substrate (or joined with another package) by reflowing solder bumps between the package and the substrate or other package, and then, an underfill is drawn by capillary action into the area between the package and the substrate or other package. More recently, no-flow underfill material has been applied directly to the substrate or other package, and then the package is pressed onto the underfill. In both scenarios, the entire area between the package and the substrate or other package is filled with underfill for solder joint reliability.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
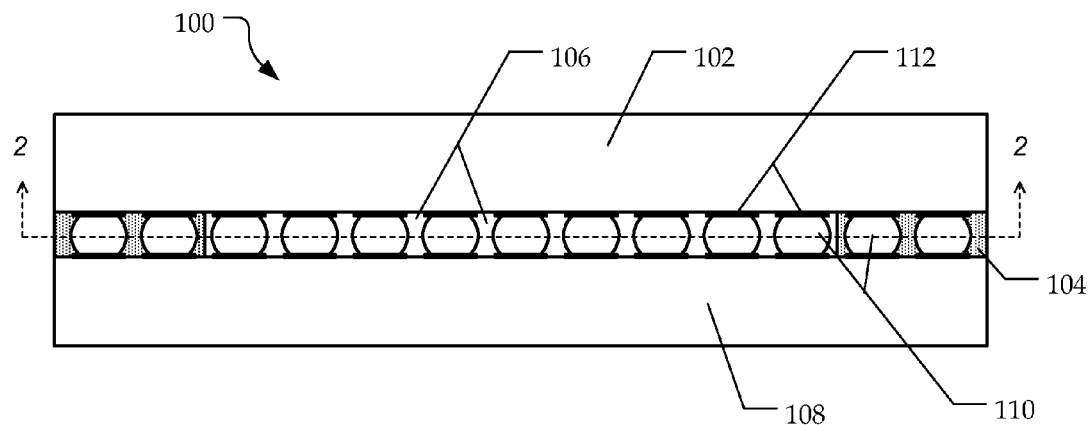
FIG. 1 illustrates a cross-sectional view of an example apparatus comprising a package including an underfill material in a portion of an area between the package and a substrate or another package.

all arranged in accordance with various embodiments of the present disclosure.

DETAILED DESCRIPTION OF THE EMBODIMENTS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to a package including an underfill in a portion of an area between the package and a substrate or another package. Embodiments include, but are not limited to, methods, apparatuses, and systems. Other embodiments may also be disclosed and claimed.

The present disclosure recognizes that solder ball (sometimes referred to in the art as solder bumps or solder joints) pitches are becoming increasingly fine, and that underfill material is typically applied in an entirety of a space between a package and a substrate or another package, in a manner that fully encases the solder balls, in order to help improve solder joint reliability. In contravention to this practice, this disclosure is drawn to an apparatus comprising a substrate or a first package, and a second package coupled to the substrate or the first package, wherein the second package includes at least one die and an underfill material disposed in a portion, but not an entirety, of an area between the package and the substrate or the first package. In various embodiments, the underfill material may be selectively applied to solder joint areas that tend to be weak (under thermal cycling or drop test, for example). Such selective application of underfill material may reduce underfill material consumption relative to other methods, while still providing solder joint reliability.

FIG. 1 illustrates an example apparatus 100 comprising a package 102 including an underfill material 104 in a portion, but not an entirety, of an area 106 between the package 102 and a substrate or another package 108, arranged in accordance with at least some embodiments of the present disclosure. As illustrated, at least another portion of the area 106 between the package 102 and the substrate or another package 108 is substantially free of the underfill material 104.

A plurality of solder joints 110 may couple the package 102 to the substrate or another package 108. One or both of the package 102 and the substrate or another package 108 may include traces or pads 112 for routing signals. The underfill material 104 may be disposed around at least one of the plurality of solder joints 110.

Figure 2:
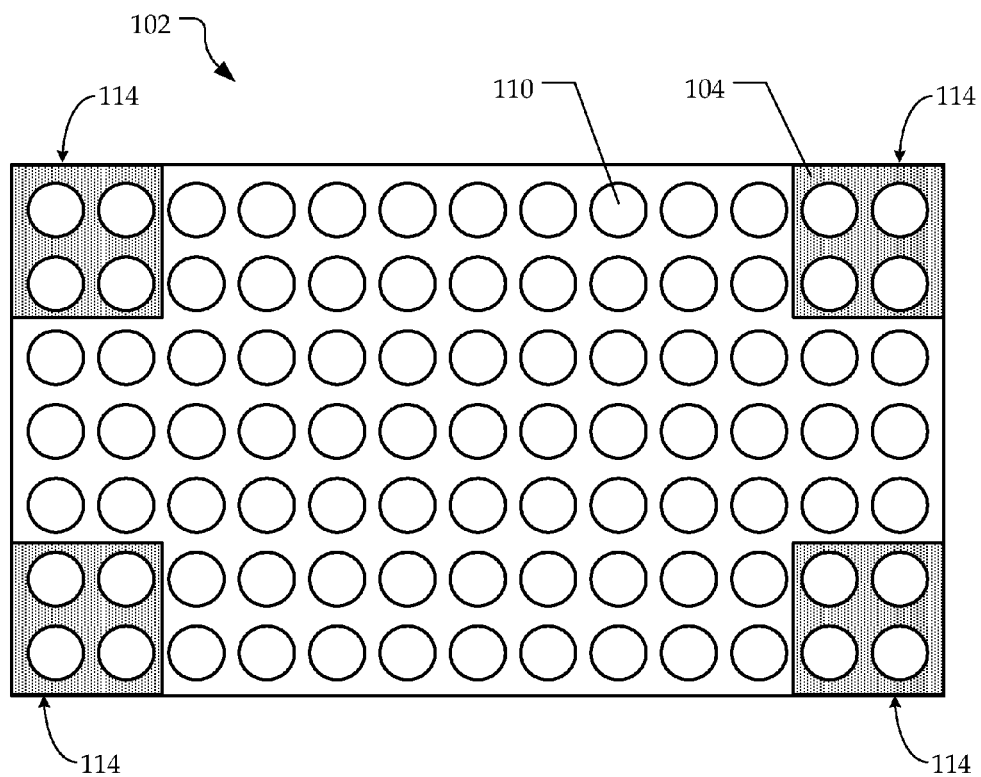
FIG. 2 illustrates a cross-sectional view of an example configuration of the example apparatus of FIG. 1.
Figure 3:
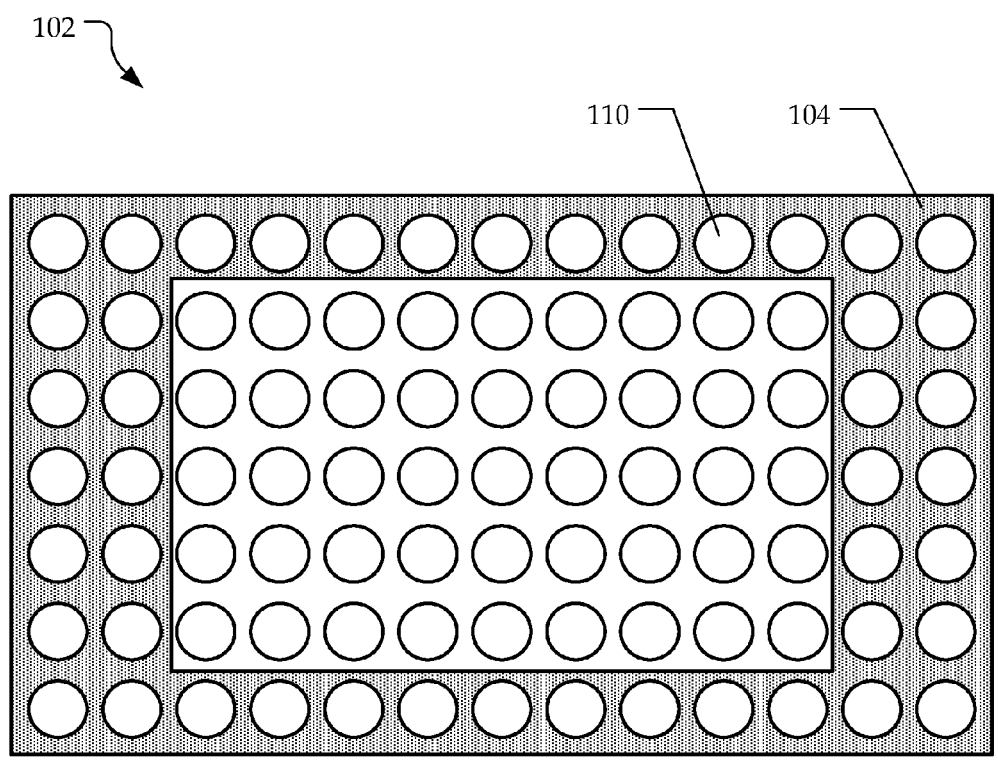
FIG. 3 illustrates a cross-sectional view of another example configuration of the example apparatus of FIG. 1.

The underfill material 104 may be disposed in any portion or portions of the area 106 between the package 102 and the substrate or another package 108. In various embodiments, the underfill material 104 may be disposed to a portion or portions of the area 106 that tend to exhibit solder joint failure. For example, FIG. 2 illustrates the apparatus of FIG. 1 taken along line 2-2, in which the underfill material 104 may be disposed between the substrate or another package 108 and at least one corner 114 of the package 102. Although the depicted embodiment illustrates the underfill material 104 being at each of the four corners 114 of the package 102, in some embodiments the underfill material 104 may be disposed at fewer than each of the four corners 108 of the package 102. In various other embodiments, the underfill material 104 may be disposed along a periphery of the package 102 as illustrated in FIG. 3. Numerous other configurations are possible. For example, underfill material 104 may be disposed in a center of the package instead of or in addition to the corners 114 or the periphery of the package 102.

The underfill material 104 may comprise any material suitable for the purpose, whether flow-type or no-flow type. Example underfill materials may include, for example, epoxy, silicone, or the like. In various embodiments, the underfill material 104 may comprises an epoxy flux material for which further application of flux may not be necessary. Other materials may be similarly suitable.

The package 102 may be any type of package typically coupled to a substrate or another package by solder joints. For example, various embodiments of the present disclosure may be implemented for package-on-packages (PoP), multi-chip modules (MOM), or chip-scale packages (CSP). FIGS. 4-9 illustrate various example apparatuses comprising a package including an underfill material in a portion of an area between the package and a substrate or another package.

Figure 4:
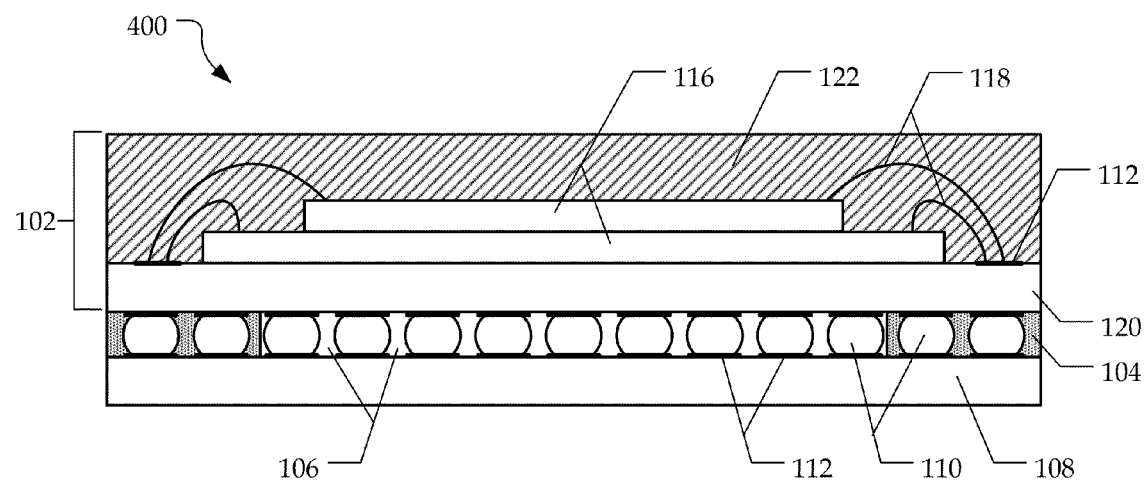
FIG. 4 illustrates a cross-sectional view of an example apparatus comprising a package including an underfill material in a portion of an area between the package and a substrate.

FIG. 4 illustrates a cross-sectional view of an example apparatus 400 comprising a package 102 including an underfill material 104 in a portion of an area 106 between the package 102 and a substrate 108, arranged according to at least some embodiments described herein. A plurality of solder joints 110 may couple the package 102 to the substrate 108. The package 102 may include at least one die 116 (two dies are illustrated) mounted on a carrier substrate 120, and the at least one die 116 may be electrically coupled by wires 118 to conductive traces or pads 112 of the carrier substrate 120. An encapsulant material 122 (sometimes referred to in the art as mold compound) may be formed over the at least one die 116, forming the package 102.

Figure 5:
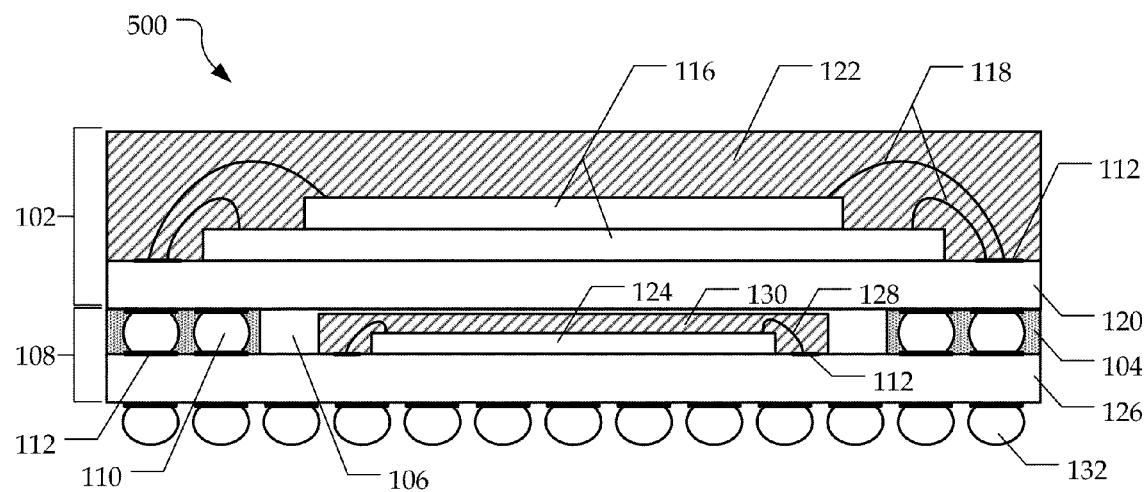
FIG. 5 illustrates a cross-sectional view of an example apparatus comprising a package including an underfill material in a portion of an area between the package and another package.

FIG. 5 illustrates a cross-sectional view of an example PoP apparatus 500 comprising a package 102 including an underfill material 104 in a portion of an area 106 between the package 102 and another package 108, arranged according to at least some embodiments described herein. A plurality of solder joints 110 may couple the package 102 to the other package 108. The package 102 may include at least one die 116 (two dies are illustrated) mounted on a carrier substrate 118, and the at least one die 116 may be electrically coupled by wires 118 to conductive traces or pads 112 of the carrier substrate 120. An encapsulant material 122 may be formed over the at least one die 116, forming the package 102.

The other package 108 may include at least one die 124 mounted on a carrier substrate 126, and the at least one die 124 may be electrically coupled by wires 128 to conductive traces or pads 112 of the carrier substrate 126. An encapsulant material 130 may be formed over the at least one die 124, forming the package 108.

Although not illustrated, the apparatus 500 may be mounted onto another substrate or another package. In some embodiments, the apparatus 500 may be mounted to another substrate or another package via another plurality of solder joints 132.

Figure 6:
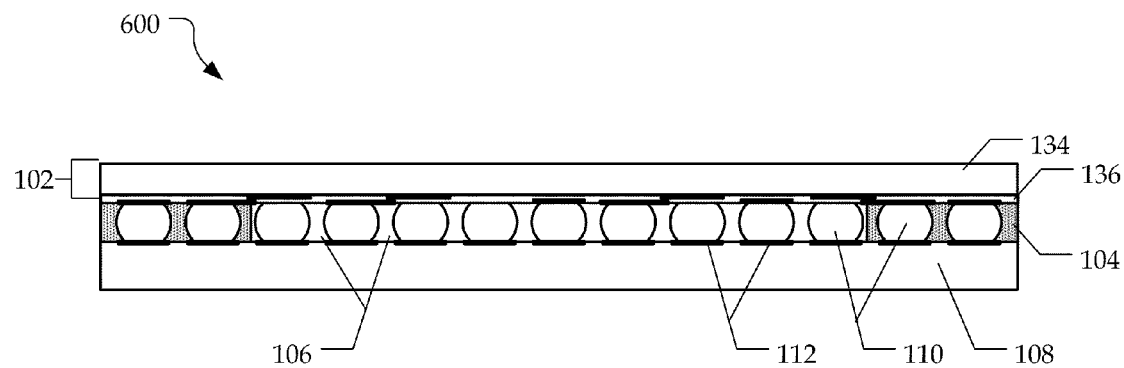
FIG. 6 illustrates a cross-sectional view of another example apparatus comprising a package including an underfill material in a portion of an area between the package and a substrate.

FIG. 6 illustrates a cross-sectional view of an example apparatus 600 comprising a CSP package 102 including an underfill material 104 in a portion of an area 106 between the package 102 and a substrate 108, arranged according to at least some embodiments described herein. The package 102 may include at least one die 134 and an optional redistribution layer 136 coupling the die 134 to the substrate 108 via a plurality of solder joints 110.

Figure 7:
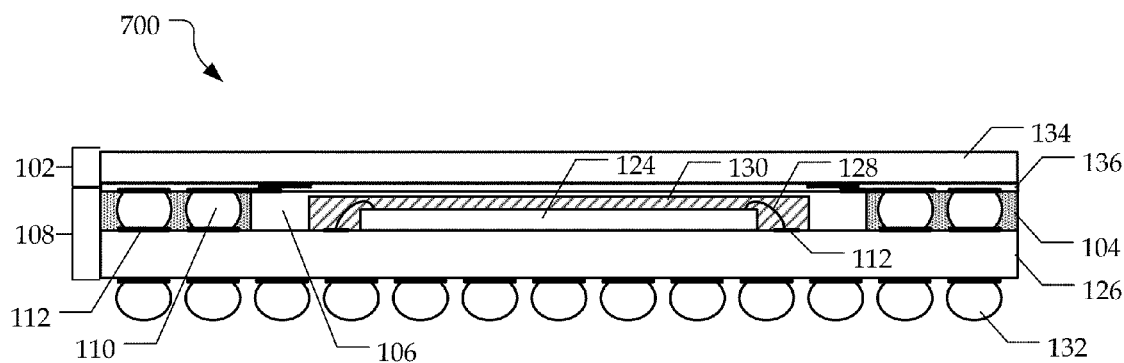
FIG. 7 illustrates a cross-sectional view of another example apparatus comprising a package including an underfill material in a portion of an area between the package and another package.

FIG. 7 illustrates a cross-sectional view of an example apparatus 700 comprising a CSP package 102 including an underfill material 104 in a portion of an area 106 between the package 102 and another package 108, arranged according to at least some embodiments described herein. The package 102 may include at least one die 116 and an optional redistribution layer 132 coupling the die 116 to the other package 108 via a plurality of solder joints 110.

The other package 108 may include at least one die 124 mounted on a carrier substrate 126, and the at least one die 124 may be electrically coupled by wires 128 to conductive traces or pads 112 of the carrier substrate 126. An encapsulant material 130 may be formed over the at least one die 124, forming the package 108.

Although not illustrated, the apparatus 700 may be mounted onto another substrate or another package. In some embodiments, the apparatus 500 may be mounted to another substrate or another package via another plurality of solder joints 132.

Figure 8:
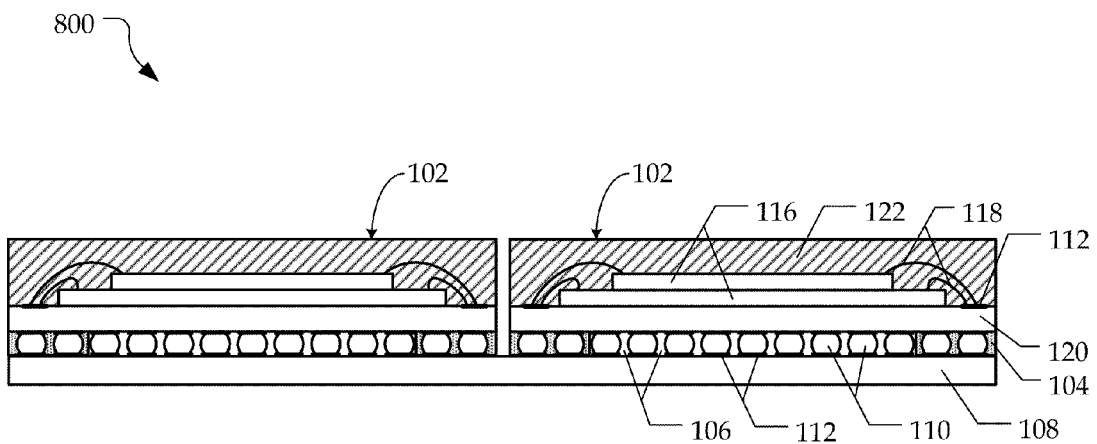
FIG. 8 illustrates a cross-sectional view of an example multi-chip module apparatus comprising a plurality of packages including an underfill material in a portion of an area between the packages and a substrate.

FIG. 8 illustrates a cross-sectional view of an example MOM apparatus 800 comprising a plurality of packages 102 including an underfill material 104 in a portion of an area 106 between each of the packages 102 and the substrate 108, arranged according to at least some embodiments described herein. A plurality of solder joints 110 may couple the packages 102 to the substrate 108. The packages 102 may each include at least one die 116 (two dies are illustrated) mounted on a carrier substrate 118, and the at least one die 116 may be electrically coupled by wires 118 to conductive traces or pads 112 of the carrier substrate 120. An encapsulant material 122 (sometimes referred to in the art as mold compound) may be formed over the at least one die 116, forming the packages 102. Although not illustrated, the apparatus 800 may be mounted onto another substrate or another package.

Figure 9:
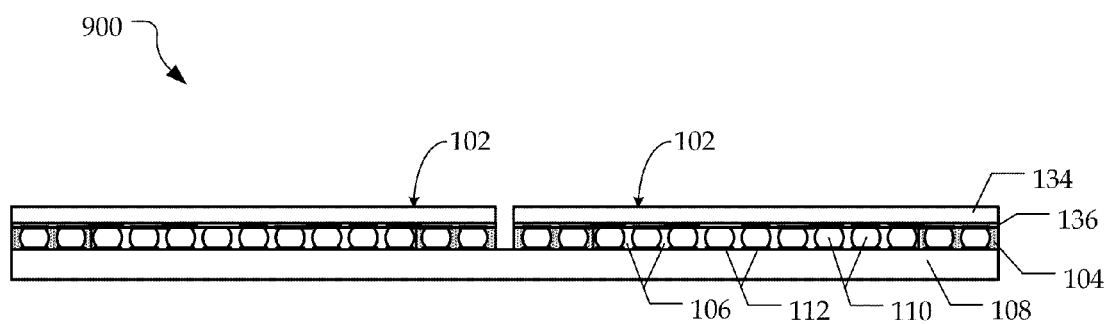
FIG. 9 illustrates a cross-sectional view of another example multi-chip module apparatus comprising a plurality of packages including an underfill material in a portion of an area between the packages and a substrate.

FIG. 9 illustrates a cross-sectional view of another example MOM apparatus 900 comprising a plurality of CSP packages 102 including an underfill material 104 in a portion of an area 106 between each of the packages 102 and the substrate 108, arranged according to at least some embodiments described herein. A plurality of solder joints 110 may couple the packages 102 to the substrate 108. Each of the packages 102 may include at least one die 116 and an optional redistribution layer 132 coupling the dies 116 to the substrate 108 via a plurality of solder joints 110. Although not illustrated, the apparatus 900 may be mounted onto another substrate or another package.

Although the MOM apparatuses 800, 900 each include a plurality of the same form of packages 102 (e.g., package 900 includes a plurality of CSP packages), the present disclosure is not so limited. MOM apparatuses within the scope of the present disclosure may include various forms of packages.

Figure 10:
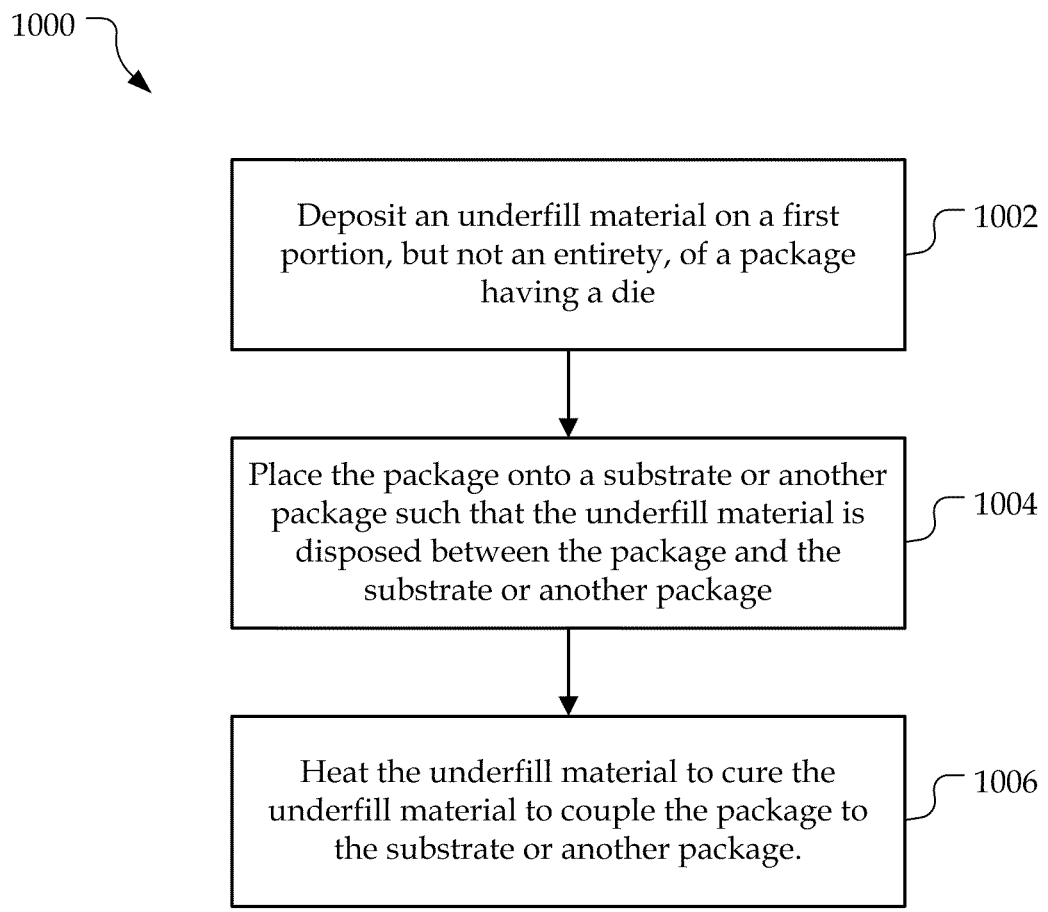
FIG. 10 is a flow diagram illustrating some of the operations associated with an example method of making an apparatus comprising a package including an underfill material in a portion of an area between the package and a substrate or another package.

The apparatuses of FIGS. 1-9 may be more clearly understood with reference to FIG. 10. FIG. 10 is a flow diagram illustrating some of the operations associated with an example method of making an apparatus comprising a package including an underfill material in a portion of an area between the package and a substrate or another package, arranged in accordance with at least some embodiments of the present disclosure. It should be noted that although the method is illustrated as a series of sequential steps, the method is not necessarily order dependent. Moreover, methods within the scope of this disclosure may include more or fewer steps than that illustrated.

Turning now to FIG. 10, with continued reference to various elements of the apparatuses of FIGS. 1-9, the method 1000 may include one or more functions, operations, or actions as is illustrated by block 1002, block 1004, and/or block 1006. Processing for the method 1000 may start with block 1002, "Deposit an underfill material on a first portion, but not an entirety, of a first surface of a package having a die." In various embodiments, the underfill material may be deposited around at least one of a plurality of solder bumps disposed in between the package and the substrate or another package. The underfill material may be deposited on one or more corners of the package, the periphery of the package, or any other portion of the solder bump area of the package. The underfill material may be deposited in a manner such that at least another portion of the area between the package and the substrate is substantially free of the underfill material.

Any suitable method may be used for depositing the underfill material. For example, the underfill material may be deposited by screen printing, dispensing, or jetting the underfill material onto the first portion of the package. In various embodiments, the underfill material may be deposited by dipping the first portion of the package into the underfill material. The underfill material may be deposited before or after singulation of the packages from a substrate strip.

From block 1002, method 1000 may proceed to block 1004, "Place the package onto a substrate or another package such that the underfill material is disposed between the package and the substrate or another package."

From block 1004, method 1000 may proceed to block 1006, "Heat the underfill material to cure the underfill material to couple the package to the substrate or another package." In various embodiments, the underfill material may be cured substantially simultaneously with reflowing the plurality of solder bumps disposed between the package and the substrate or another package to form a corresponding plurality of solder joints.

In various applications, block 1002 may optionally be performed by a manufacturer of the package, and then the package having the underfill deposited thereon may be distributed to an OEM or system integrator to be joined with the package or another package at block 1004.

FIGS. 11-14 illustrate cross-sectional views of various stages of an apparatus comprising a package including an underfill material in a portion of an area between the package and a substrate or another package, manufactured with an example method, arranged according to at least some embodiments described herein.

Figure 11:
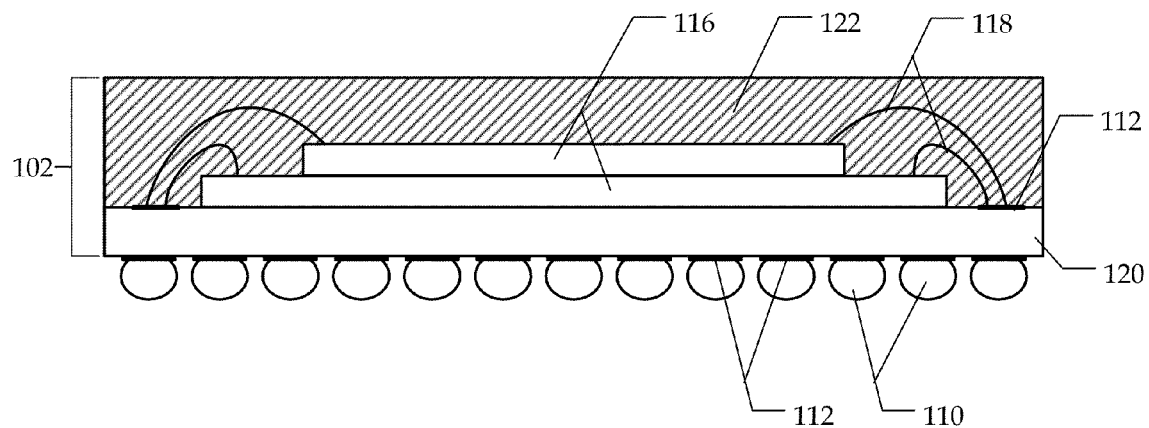
FIGS. 11-14 illustrate cross-sectional views of various stages of an apparatus comprising a package including an underfill material in a portion of an area between the package and a substrate or another package, manufactured with an example method.

As illustrated in FIG. 11, a package 102 is provided. The package 102 includes at least one die 116 (two dies are illustrated) mounted on a carrier substrate 120, and the at least one die 116 may be electrically coupled by wires 118 to conductive traces or pads 112 of the carrier substrate 120. A plurality of solder bumps 110 may be provided on the package 102 for mounting the package onto a substrate or another package.

Figure 12:
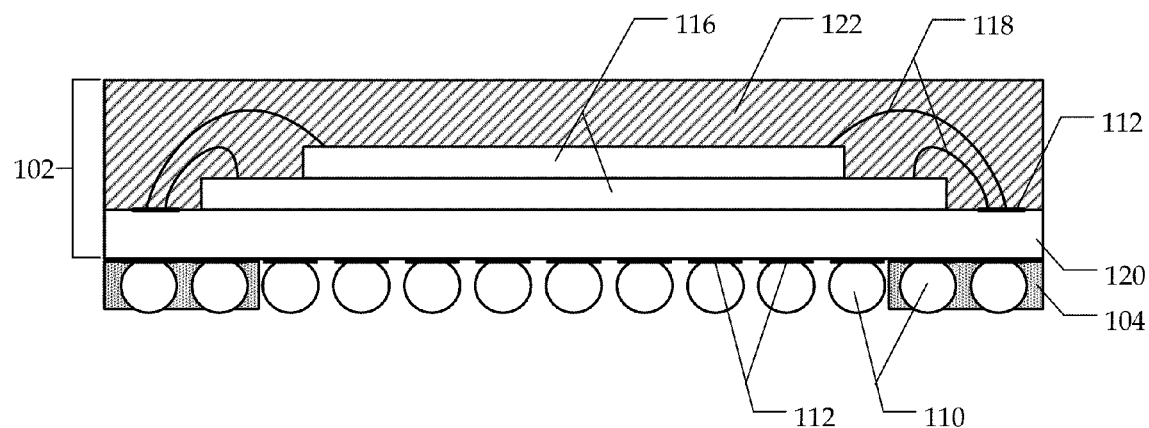
Figure 13:
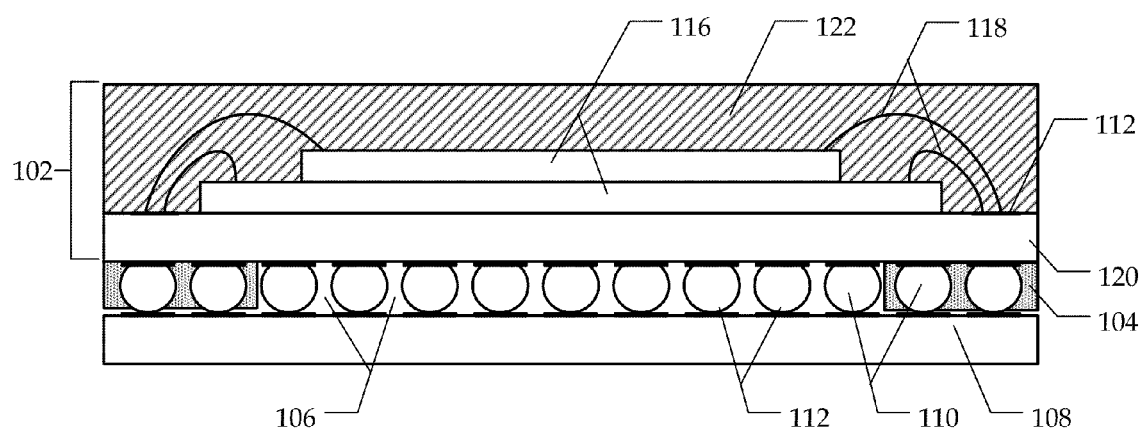
Figure 14:
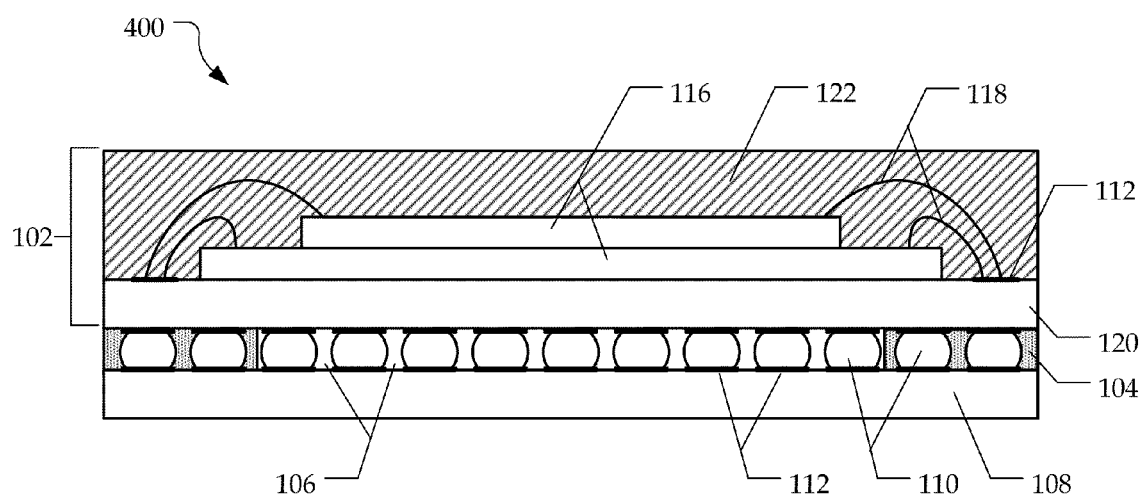

An underfill material 104 may then be deposited onto a portion, but not an entirety, of the package 102, as illustrated in FIG. 12. After depositing the underfill material 104 onto the package 102, the package 102 may be placed onto a substrate or another package 108 such that the underfill material 104 is disposed between the package 102 and the substrate or another package 108, as illustrated in FIG. 13. Then, the underfill material 104 may be heated to cure the underfill material 104 to couple the package 102 to the substrate or another package 108. As discussed herein, in various applications, the underfill material 104 may be deposited onto the package 102 by a manufacturer of the package 102, and then the package 102 having the underfill material 104 deposited thereon may be distributed to an OEM or system integrator to be joined with the package or another package 108.

Figure 15:
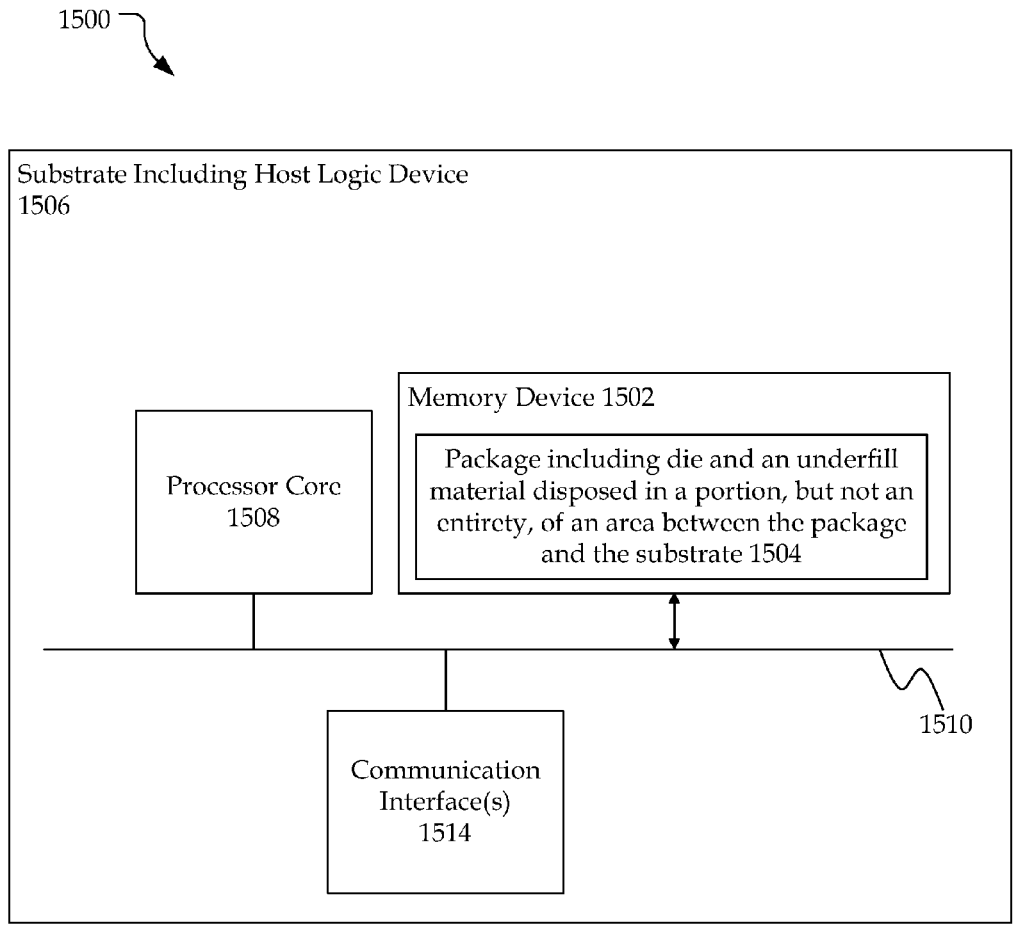
FIG. 15 is a block diagram of an example system including an apparatus comprising a package including an underfill material in a portion of an area between the package and a substrate or another package.

Embodiments of apparatuses described herein may be incorporated into various other apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an exemplary system 1500 is illustrated in FIG. 15. As illustrated, the system 1500 may include a memory device 1502. In various embodiments, memory device 1502 may be a volatile or a non-volatile memory device. In various embodiments, memory device 1502 may be a NAND, NOR, or phase change non-volatile flash memory device. In various embodiments, memory device 1502 may include a memory apparatus comprising a package including an underfill material in a portion of an area between the package, and a substrate or another package (collectively, 1504) to which the memory apparatus including the package is mounted or joined. In various embodiments, the another package may be another similar memory apparatus. In other words, memory device 1502 may be a multi-package device. Example memory apparatuses may include any one or more of the apparatuses 100, 400, 500, 600, 700, 800, or 900 described herein.

In various embodiments, memory device 1502 may be operatively coupled to a host logic device 1506. In various embodiments, the host logic device 1506 may be mounted to the same substrate memory device 1502 is mounted. In other embodiments, memory device 1502 may be joined with host logic device 1502. In various embodiments, the host logic device 1506 may be a microcontroller, a digital signal processor or a general purpose microprocessor. In various embodiments, the host logic device 1506 may include a processor core 1508 or a plurality of processor cores 1508.

In various embodiments, the system 1500 may comprise a host logic device bus 1510 to operatively couple the memory device 1502 and the host logic device 1506, including electrically coupling memory device 1502 and the host logic device 1506. In various embodiments, host logic device bus 1510 may be disposed on a substrate to which both memory 1502 and host logic device 1506 are mounted.

In various embodiments, the system 1500 may further include communications interface(s) 1514 (coupled e.g., also to host logic device bus 1510) to provide an interface for system 1500 to communicate over one or more networks and/or with any other suitable device. Communications interface(s) 1514 may include any suitable hardware and/or firmware. Communications interface(s) 1514 for one embodiment may include, for example, a network adapter, a wireless network adapter, a telephone modem, and/or a wireless modem. For wireless communications, communications interface(s) 1514 for one embodiment may use one or more antennas (not illustrated).

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Various operations may be described as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus comprising:
   a substrate or a first package;
   a second package coupled to the substrate or the first package, wherein the second package includes at least one die; and
   a plurality of solder joints coupling the second package to the substrate or the first package, wherein an underfill material is disposed around a first one of the plurality of solder joints that couples second package to the substrate or the first package, and wherein a second one of the plurality of solder joints that couples the second package to the substrate or the first package has substantially no contact with the underfill material.

2. The apparatus of claim 1, wherein the plurality of solder joints is a first plurality of solder joints, and wherein the apparatus further comprises a third package coupled to the substrate by a second plurality of solder joints.

3. The apparatus of claim 1, wherein the underfill material is disposed between at least one corner of a surface of the second package and the substrate or the first package, and wherein substantially no underfill material is disposed between a center of the surface of the second package and the substrate or the first package.

4. The apparatus of claim 1, wherein the plurality of solder joints are disposed in an area between the second package and the substrate or the first package, wherein the underfill material is disposed in a first portion of the area between the package and the substrate or the first package, and wherein a second portion of the area between the second package and the substrate or the first package is substantially free of the underfill material.

5. The apparatus of claim 1, wherein the underfill material is a no-flow underfill material.

6. The apparatus of claim 1, wherein the underfill material is an epoxy flux material.

7. The apparatus of claim 1, wherein the second package is a chip scale package.

8. A method comprising: depositing an underfill around a first one of a plurality of solder bumps of a package having a die such that the underfill material has substantially no contact with a second one of the plurality of solder bumps; placing the package onto a substrate or another package such that plurality of solder bumps and the underfill material is disposed between the package and the substrate or another package; and heating the underfill material to cure the underfill material to couple the package to the substrate or another package such that the second one of the plurality of solder bumps electrically couples the package to the substrate or another package and has substantially no contact with the underfill material.

9. The method of claim 8, wherein depositing the underfill material comprises depositing the underfill material on at least one corner of a surface of the package, leaving an area between a center of the surface of the second package and the substrate or the first package substantially free of the underfill material.

10. The method of claim 8, wherein depositing the underfill material comprises depositing the underfill material in a first portion of a surface of the package and leaving a second portion of the surface substantially free of the underfill material.

11. The method of claim 8, wherein heating comprises curing the underfill material substantially simultaneously with reflowing the plurality of solder bumps to form a corresponding plurality of solder joints.

12. The method of claim 8, wherein depositing the underfill material comprises screen printing, dispensing, or jetting the underfill material onto the package.

13. The method of claim 8, wherein depositing the underfill material comprises dipping the package into the underfill material.

14. A system comprising:
a substrate including a host logic device bus;
a flash memory device including a package physically coupled to the substrate, wherein the package includes at least one die, wherein a plurality of solder joints couple the package to the substrate, wherein an underfill material is disposed around a first one of the plurality of solder joints, wherein a second one of the plurality of solder joints that couples the package to the substrate has substantially no contact with the underfill material, and wherein the flash memory device is electrically coupled to the host logic device bus; and
a host logic device physically mounted to the substrate, and electrically coupled with the host logic device bus.

15. The system of claim 14, wherein the flash memory device comprises phase change memory device.

16. The system of claim 14, wherein the package is a first package, the plurality of solder joints is a first plurality of solder joints, and the underfill material is a first underfill material, and wherein the flash memory device includes a second package physically coupled to the first package wherein a second plurality of solder joints couple the second package to the first package, wherein a second underfill material is disposed around a first one of the second plurality of solder joints, wherein a second one of the second plurality of solder joints has substantially no contact with the second underfill material.

17. The system of claim 14, wherein the host logic device comprises a plurality of processor cores.

18. The system of claim 14, wherein the system is a selected one of a set-top box, a digital recorder, a game console, a personal digital assistant, a mobile phone, a digital media player, or a digital camera.

19. A method comprising:
depositing an underfill material around a first one of a plurality of solder bumps of a package having a die such that the underfill material has substantially no contact with a second one of the plurality of solder bumps, for subsequent placing of the package onto a substrate or another package such that the second one of the plurality of solder bumps electrically couples the package to the substrate or another package and the underfill material and the plurality of solder bumps are disposed between the package and the substrate or another package; and
distributing the package with an underfill material deposited around the first one of the plurality of solder bumps for placing on the substrate or another package.

20. The method of claim 19, wherein depositing the underfill material comprises depositing the underfill material on at least one corner of a surface of the package, leaving an area between a center of the surface of the package substantially free of the underfill material.

21. A method comprising:
placing a package having a die, a plurality of solder bumps, and an underfill material onto a substrate or another package such that the underfill material is disposed between the package and the substrate or another package, wherein the package being placed has been deposited with the underfill material around a first one of the plurality of solder bumps such that the underfill material has substantially no contact with a second one of the plurality of solder bumps that couples the package to the substrate or another package; and
heating the underfill material to cure the underfill material to couple the package to the substrate or another package.

22. The method of claim 21, wherein heating comprises curing the underfill material substantially simultaneously with reflowing the plurality of solder bumps to form a corresponding plurality of solder joints.

23. The apparatus of claim 1, wherein the plurality of solder joints are disposed directly between the second package and the substrate or the first package.

24. The apparatus of claim 1, wherein the underfill material is in direct contact with the first one of the plurality of solder joints.

25. The apparatus of claim 1, further comprising an encapsulant material encapsulating, at least in part, the second package.

26. The apparatus of claim 1, wherein the underfill material is located only at corners of the substrate or the first package.

27. The apparatus of claim 26, wherein a plurality of regions of the underfill material are at respective corners of the substrate or the first package.

28. The apparatus of claim 27, wherein the regions of the underfill material are spaced apart from one another.

29. The apparatus of claim 1, wherein the second one of the plurality of solder joints electrically couples a pad of the second package to a pad of the substrate or the first package, wherein the underfill material has substantially no contact with the pad of the second package and the pad of the substrate or the first package.

30. The method of claim 8, further comprising:
electrically coupling the package to the substrate using the second one of the plurality of solder bumps which has substantially no contact with the underfill material.

31. The system of claim 14, wherein the second one of the plurality of solder joints electrically couples a pad of the package to a pad of the substrate.

32. The method of claim 19, further comprising coupling the package to the substrate or another package using the second one of the plurality of solder bumps, the underfill material has substantially no contact with the second one of the plurality of solder bumps after coupling the package to the substrate or another package.

* * * * *

UNITED STATES PATENT AND TRADEMARK OFFICE
CERTIFICATE OF CORRECTION

PATENT NO. : 8,451,620 B2
APPLICATION NO. : 12/627937
DATED : May 28, 2013
INVENTOR(S) : Myung Jin Yim et al.

Page 1 of 1

It is certified that error appears in the above-identified patent and that said Letters Patent is hereby corrected as shown below:

In the Claims:

In column 8, line 41, in Claim 1, delete "second" and insert -- the second --, therefor.

Signed and Sealed this
Twenty-third Day of July, 2013

Teresa Stanek Rea
*Acting Director of the United States Patent and Trademark Office*